United States Patent
Weng et al.

(10) Patent No.: US 6,867,081 B2
(45) Date of Patent: Mar. 15, 2005

(54) SOLUTION-PROCESSED THIN FILM TRANSISTOR FORMATION METHOD

(75) Inventors: Jian-gang Weng, Corvallis, OR (US); David M. Kwasny, Corvallis, OR (US); David Orr, Philomath, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/633,208

(22) Filed: Jul. 31, 2003

(65) Prior Publication Data

US 2005/0026344 A1 Feb. 3, 2005

(51) Int. Cl.$^7$ ................... H01L 21/336; H01L 21/8234

(52) U.S. Cl. ...................................... 438/197; 438/662

(58) Field of Search ................................. 438/197, 142, 438/153, 154, 155, 159, 266, 535, 663, 795, 799, 662, 961

(56) References Cited

U.S. PATENT DOCUMENTS

| | | | |
|---|---|---|---|
| 5,264,072 A | * 11/1993 | Mukai | 117/43 |
| 5,817,548 A | * 10/1998 | Noguchi et al. | 438/160 |
| 5,893,730 A | * 4/1999 | Yamazaki et al. | 438/166 |
| 5,923,962 A | * 7/1999 | Ohtani et al. | 438/150 |
| 6,410,368 B1 | 6/2002 | Kawasaki et al. | |
| 2003/0008224 A1 | 1/2003 | Fujita et al. | |
| 2003/0076048 A1 | 4/2003 | Rutherford | |

FOREIGN PATENT DOCUMENTS

WO    WO 02/095805    11/2002

OTHER PUBLICATIONS

Christophe Vaucher, "The Sharper Image—Christopher Vaucher", http://www.circuitree.com/CDA/ArticleInformation/features/BNP_Features_Item/0,2133,28551,00. html.

OLED Laser Ablation Tools and OLED Laser Ablation System Features Display pages, www.resonetics.com/display.

D. B. Mitzi, K. Chondroudis, and C. R. Kagan, "Organic–inorganic electronics", IBM Journal of Research and Development, vol. 45, No. 1, 2001, pp. 1–14.

Abstract Digest: SPIE Conference 4800, Organic Light Emitting Materials and Devices VI.

Kenkicki Suzuki, Nobuaki Hayashi, Hiroshi Masuhara, and Thomas K. Uppert, "Ablation Lithography for TFT–LCD", Mat. Res. Soc. Symp. Proc. vol. 685E, 2001 Materials Research Society, pp. D1.2.1–D1.2.10.

Brent A. Ridley, Babak Nivi, Joseph M. Jacobson, "All–Inorganic Field Effect Transistors Fabricated by Printing", www.sciencemag.org, Science, vol. 286, Oct. 22, 1999, pp. 746–749.

Linda T. Creagh, Susanne Haun, Neil Tallant, "Development of Improved Ink Jet Deposition Processes for Polymer OLED Materials", pp. 1–3.

Karel Vanheusden, Klaus Kunze, hugh Denham, Aaron Stump, Allen Schult, Jenny Plakio, and Tolvo Kodas, Superior MicroPowders LLC., Mike Renn, Marcellno Essien, and Bruce King, Optomec Inc., "Direct Printing of Interconnect Materials for Organic Electronics", pp. 1–5.

D. Schäfer, J. Ihlermann, G. Marowsky, P.R. Herman, "F2–laser ablation patterning of dielectric layers", Applied Physics A, Materials Science & Processing, vol. 72, pp. 372–379 (2001).

(List continued on next page.)

Primary Examiner—David Nhu

(57) ABSTRACT

An exemplary solution-processed thin film transistor formation method of the invention forms solution-processed thin film layers into a transistor structure. During formation, semiconductor portions of the transistor structure are selectively heated via a laser to modify the material state of semiconductor material from a solution deposited material state to a thin film layer material state.

47 Claims, 7 Drawing Sheets

OTHER PUBLICATIONS

H. Sirringhaus, T. Kawase, R.H. Friend, T. Shimoda, M. Inbasekaran, W. Wu, and E.P. Woo, "High-Resolution Inkjet Printing of All-Polymer Transistor Circuits", www.sciencemag.org, Science, vol. 290, Dec. 15, 2000, pp. 2123–2126.

J. Norman Bardsley, "International OLED Technology Roadmap: 2001–2010", U.S. Display Consortium.

C. David, T. Neiger, P. Häberling, J. Wei, T. Lippert, and A. Wokaun (PSI), "Laser Ablation Lithography Using Diffractive Phase Masks", Laboratory for Micro- and Nanotechnology, Paul Scherrer Institut, CH–5232, Villigen PSI, PSI annual scientific report 2000.

Hidehiko Nonaka, Tetsuya Nishiguchi, Yoshiki Morikawa, Masaharu Miyamoto, and Shingo Ichimura, "Laser Ablation of Solid Ozon ", Mat. Res. Soc. Symp. vol. 617, 2000 Materials Research Society, pp. J1.3.1–J.1.3.6.

Andrew S. Holmes, "Laser fabrication and assembly processes for MEMS", Imperial College of Science, pp. 1–10.

J.L. Speidell, D.P. Pulaski and R.S. Patel, "Masks for laser ablation technology: New requirements and challenges".

Symposium V, "Materials Development for Direct Write Technologies", vol. 624 of the Materials Research Society Symposium Proceedings Series, Apr. 24–26, 2000, pp. 352–362.

* cited by examiner

SOLUTION-PROCESSED THIN FILM TRANSISTOR FORMATION METHOD

FIELD OF THE INVENTION

The invention is in the semiconductor field. The invention particularly concerns solution-processed thin film transistors.

BACKGROUND OF THE INVENTION

Solution-processed thin film transistors hold great promise to fundamentally change the semiconductor industry. Their uses run the gamut of conventional transistor uses, and may be formed into light emitting structures. Materials used in the thin films, such as conductive polymers, are durable and can be flexible, thereby providing a range of uses in demanding environments.

The solution-processed thin film transistors also hold the potential to be fabricated by simple techniques, e.g., direct printing of circuits. A long-term goal is to have circuits of solution-processed thin film transistors printed on a substrate in similar fashion to the way ink is patterned in a printing press. Proposed manufacturing techniques seek to employ relatively simple procedures such as inkjet printing. A critical issue, however, remains feature size. Small feature sizes, e.g., small channel lengths, produce small threshold voltages and fast operation. However, introducing conventional techniques to produce small feature sizes, e.g., lithography, adds complexity and expense that contradicts the goal of achieving simply manufactured devices and circuits.

Solution-processed deposition also places demands on the materials used to form features, particularly when an ink jet deposition process is utilized. The material being deposited must have adhesion, temperature, and other material characteristics suitable for deposit through an ink jet head. On the other hand, the material deposited should quickly achieve solid phase, adhere to the substrate or material layers onto which it is deposited, and remain within the boundaries intended by the controlled ink jet deposition.

Screen printing is an example technique for patterning drain and source regions of solution-processed thin film transistors. A gap of about 100 $\mu$m may be produced by this technique. Other techniques may produce smaller sized gaps, but have limitations such as being limited to use on small substrates. An example is a technique that converts portions of organic polymer materials to dielectric through selective use of UV radiation. Thus, there remains a need for solution-processed thin film formation methods capable of producing small feature sizes.

SUMMARY OF THE INVENTION

An exemplary solution-processed thin film transistor formation method of the invention forms solution-processed thin film layers into a transistor structure. During formation, semiconductor portions of the transistor structure are selectively heated via a laser to modify the material state of semiconductor material from a solution deposited material state to a thin film layer material state.

DETAILED DESCRIPTION OF THE PREFERRED EMBODIMENTS

Figure 1:
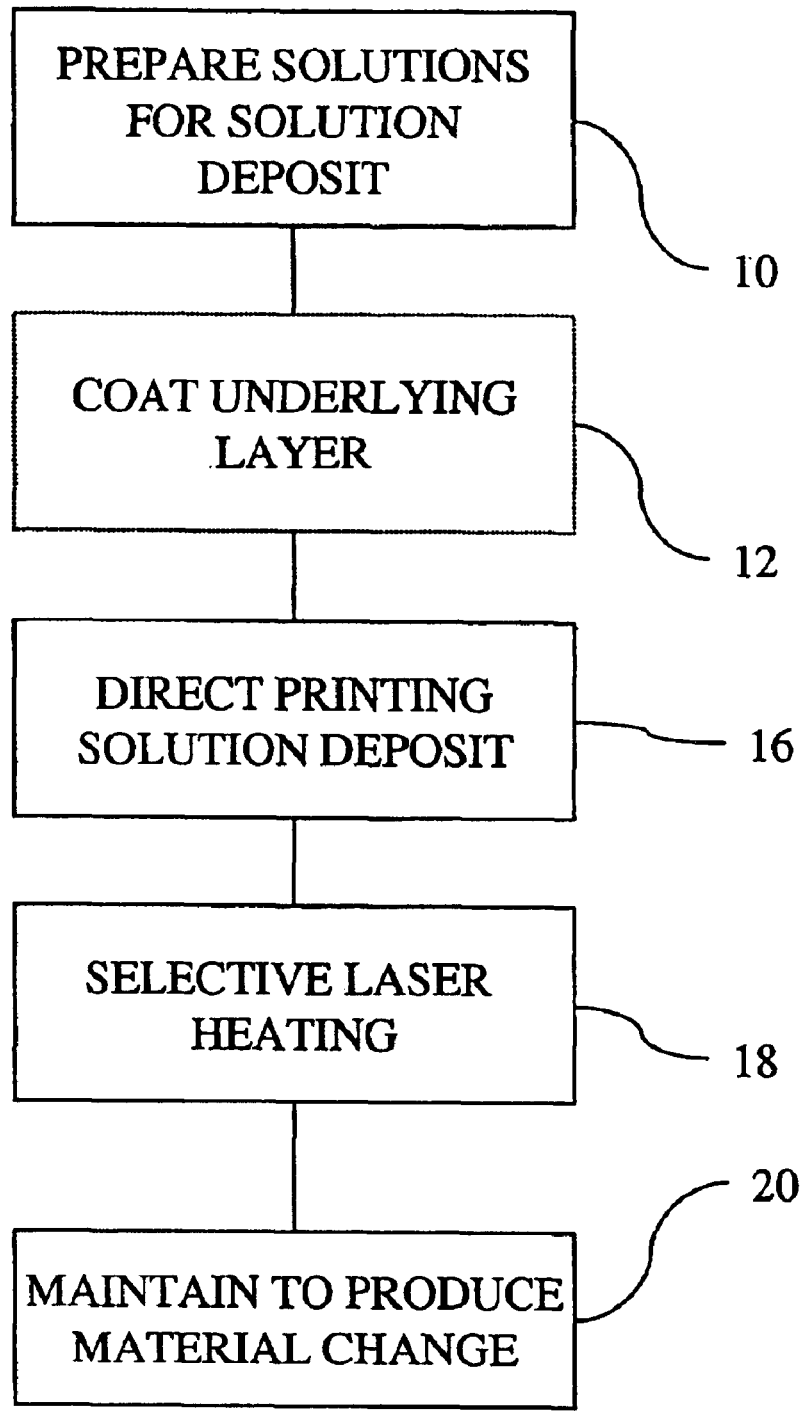
FIG. 1 is a block diagram of an exemplary embodiment method for solution-processed thin film transistor formation.

The invention concerns solution-processed thin film transistor formation that makes use of selective laser heating to affect a solution phase deposited semiconductor material. An exemplary solution-processed thin film transistor formation method of the invention forms solution-processed thin film layers into a transistor structure. During formation, semiconductor portions of the transistor structure are selectively heated via a laser to modify the material state of semiconductor material from a solution deposited material state to a thin film layer material state.

In exemplary embodiments, the laser heating vaporizes solvent to leave a semiconductor material that was part of the solution. At the same time, the semiconductor material released from the solvent is cured, annealed, sintered or recrystallized depending upon the particular semiconductor material being deposited. In exemplary embodiments, ablation is also employed to remove material as part of a patterning step for the semiconductor material, or for patterning conductive and dielectric thin film layers. Solution-processed, as applied to modify material and thin film and used herein, refers to those materials that are either soluble in a solution or capable of suspension in a solution so they may be processed by a solution technique, e.g., ink jet printing or spin coating, and formed into a thin film. Exemplary categories of solution-processed thin films include small molecule organic thin films and polymer thin films. The majority of the solution-processed materials that can be formed into thin films are the conductive polymers, semiconductive polymers and dielectric polymers. However, a solution-processed material may also be a suspension of small molecule organic materials in a solvent or a precursor of small organic molecular material that is soluble in a solvent. One example is the pentacene precursor that is soluble in chloroform. It can be spin-coated to form a thin film and then heated to reduce to pentacene at temperatures of ~200 C. Pentacene is a small molecular organic semiconductor instead of a polymer. Also, a solution-processed material may be a suspension of inorganic semiconductor nano-particles in a solvent that may be solution-processed to form thin films.

In exemplary embodiments, a solution based processing is used to roughly pattern a portion of a solution-processed thin film transistor being formed. For example, solution processing techniques may form into a rough pattern conductive solution-processed thin film contacts, semiconductor solution-processed thin film active regions, or dielectric solution-processed thin film isolations in a sequence and organization to form a solution-processed thin film structure capable of transistor operation. Patterning of contacts, active regions, or isolations may be refined by selective laser ablation. The ablation is preferably tuned to a wavelength to achieve maximum absorption by the material being ablated and to minimize damage to material under the material being ablated. In other embodiments of the invention, laser ablation is used to completely pattern a contact, active region, or dielectric. In such embodiments, rough patterning in the solution based processing deposition is unnecessary. As an example, conductive polymer material is deposited by solution based processing without a pattern. Selective laser ablation then is used to pattern contacts, e.g., circuit interconnect patterns, in the solution-processed conductive material. The laser radiation may also be directed through an optical mask, permitting the formation of relatively complex patterns simultaneously, e.g., the ablation of multiple channel areas at the same time.

The invention will now be illustrated with respect to exemplary embodiment thin film transistor devices. In describing the invention, particular exemplary devices and device applications will be used for purposes of illustration of the invention, but the invention is not limited to the formation of the particular illustrated devices. Dimensions and illustrated devices may be exaggerated for purposes of illustration and understanding of the invention. Reference numerals may be used in different embodiments to indicate similar features. The elements of the drawings are not necessarily to scale relative to each other. Rather, emphasis has instead been placed upon clearly illustrating the invention. A device illustrated in conventional fashion by a two-dimensional schematic layer structure will be understood by artisans to provide teaching of three-dimensional device structures and integrations.

The exemplary embodiments may be constructed with any combination of solution-processed electronic materials capable of being formed into thin films. By way of example, poly(3,4-ethylenedioxythiophene), also called PEDOT, is a conductive polymer suitable for drain, gate and source contacts. An exemplary dielectric polymer is poly (vinylphenol), also called PVP. Other exemplary polymer materials, like the specific examples, will exhibit the ability to be solution processed and formed into very thin films.

Suitable solution processed semi-conductor materials include a number of categories of materials. A first category is small molecule organic semiconductor precursors. For these materials, the annealing process is a chemical reaction in which laser provides energy for the reaction to carry on and the end product of this chemical reaction is an organic semiconductor thin film. As a specific example, pentacene can be reduced from its precursor at around 200° C. A second category is small molecule organic semiconductor suspensions. Most small molecule organic semiconductor material is not soluble in most solvents, but can be formed into a suspension. In this case, the annealing process is a physical reaction in which the laser provides energy for the organic semiconductor particles to melt after solvent is evaporated and the end product is a continuous semiconductor thin film. A third category is inorganic semiconductor nano-particles such as the CdSe nano-particle. In this case, the annealing process is a physical reaction that involves melting and solidification. A fourth category is polymer semiconductors. In general, this type of material can be dissolved in a solvent. However, aligning the deposited material in a certain direction is important. A liquid crystal type of polymer will react to heat and stretch its long chain along a specific direction. Such a directional coating material may be used according to the invention before depositing a solution of polymer semiconductor. In response to laser heating, the directional coating material will stretch, which also forces the polymer semiconductor to align. A final category is a small molecule organic semiconductor solution. Most small molecule organic semiconductors are insoluble in most solvents, so a suspension is more likely to be achieved in practice.

Referring now to FIG. 1, an exemplary embodiment method for solution-processed thin film transistor formation is illustrated. The method begins with a step (10) of preparing solutions for solution deposit of thin film layers. Suitable conductive and dielectric solutions are discussed above. In an exemplary embodiment, a semiconductor solution is prepared by dissolving small molecule organic semiconductor material, polymer semiconductor material, or small molecule organic semiconductor precursor in a solvent. In another exemplary embodiment, small molecule organic semiconductor is suspended as particles in an organic solution. In another exemplary embodiment, inorganic semiconductor material is suspended as nano-particles in an organic solution. An exemplary step (12) for the use of polymer semiconductor solutions coats a layer onto which the polymer semiconductor solution is deposited with a material that will respond directionally (anistropic) to selective laser heating to promote the formation of semiconductor polymer material along lines defined by the directional coating. The solution containing semiconductor material is deposited, preferably by a direct printing technique, and most preferably by ink jet deposition (step 16). Selective laser heating is applied to the semiconductor material (step 18). This is maintained (step 20) until a material change from solution to thin film is achieved and a solution processed semiconductor thin film is obtained.

The steps are carried out as part of a solution processed transistor formation method, in which solution processing by conventional techniques or by a corollary process to the semiconductor deposit is used to also form conductive solution-processed thin films including thin film contacts, and dielectric solution-processed thin film isolations in a sequence and organization to form a solution-processed thin film structure capable of transistor operation. The heating of the semiconductor layer (steps 18 and 20) is by a laser preferably having a wavelength and intensity to vaporize the solvent in the semiconductor solution and thereby form the semiconductor solution processed thin film active regions. The selective laser heating may also simultaneously cure, anneal, sinter or re-crystallize the solution processed semiconductor material contained in the semiconductor solution.

Figure 2:
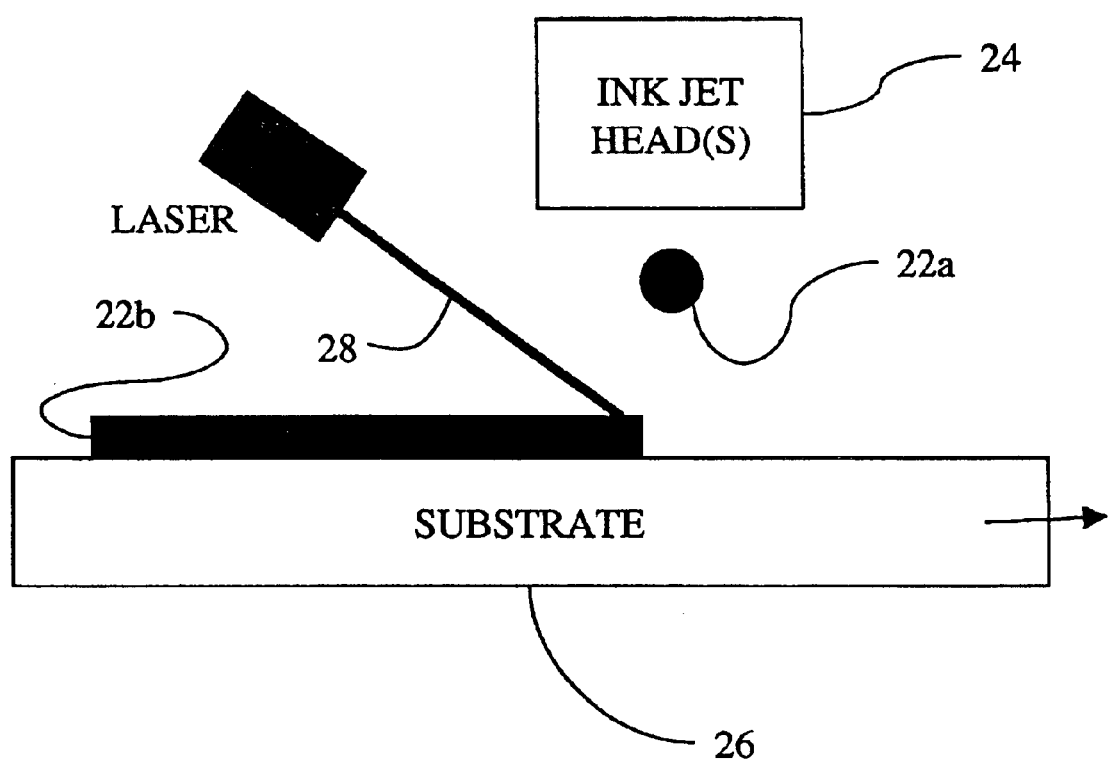
FIG. 2 is a schematic diagram of an exemplary embodiment method for solution-processed thin film transistor formation.

FIG. 2 schematically illustrates a method in accordance with the FIG. 1 exemplary embodiment for forming a solution processed semiconductor thin film. A semiconductor solution 22a is deposited from a set of ink jet heads 24 onto a substrate 26. The substrate 26 is moved with respect to the ink jet heads 24 to permit an assembly-line style deposit of prepared semiconductor solution. A laser beam 28 heats the deposited solution to change its material state into a solution-processed semiconductor thin film 22b. Patterning may be carried out as is known in the art of direct printing of semiconductors by controlling the pattern of solution deposit prior to the laser heating. In exemplary embodiments, however, and to further the ability to form a complete assembly-line style production process for transistor formation, embodiments of the invention use laser ablation to create or complete patterns in the formed solution processed semiconductor thin film, as well as conductive and dielectric thin films.

Figure 3A:
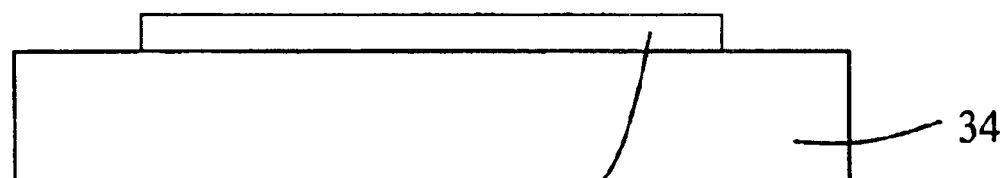
FIGS. 3A–3C are schematic block diagrams illustrating an exemplary embodiment formation method and solution-processed thin film transistor of the invention.
Figure 3B:
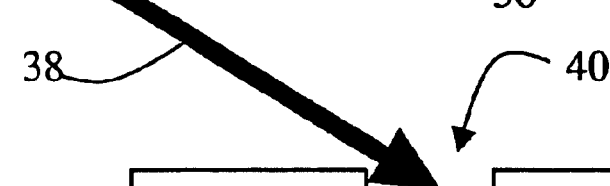
Figure 3B:
Figure 3C:
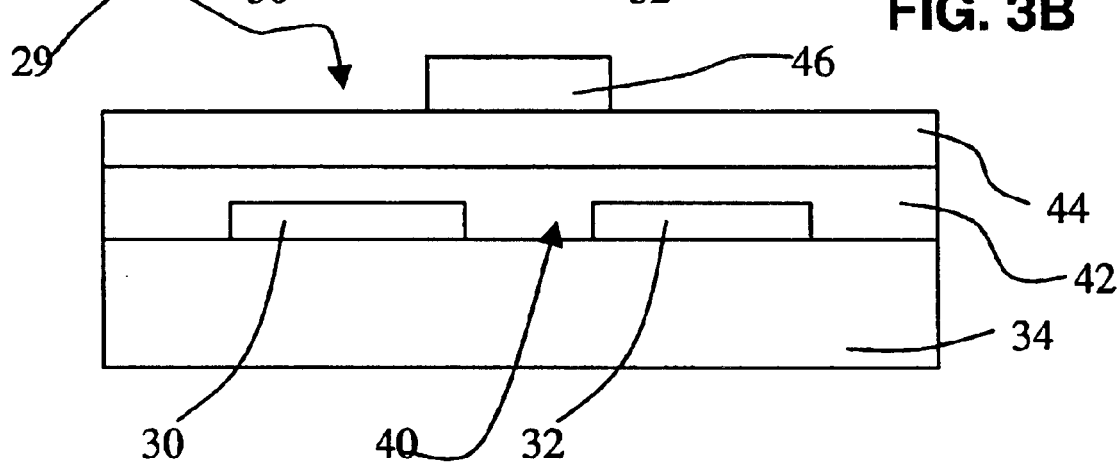

Referring now to FIGS. 3A–3C, an exemplary embodiment formation method and solution-processed thin film transistor 29 of the invention are illustrated. The transistor has source and drain contacts 30, 32 formed upon a substrate 34. The substrate 34 should have good dielectric properties and must be compatible with the solution-processed thin film materials used to form the transistor 29. Suitable exemplary substrates include glass, polycarbonate, polyarylate, polyethylenterephtalate (PET), polyestersulfone (PES), polyimide, polyolefin, and polyethylene naphthalate (PEN). Initially, conductive solution-processed thin film material 36 is deposited upon the substrate 34, preferably by inkjet printing. As an example, though a single device is illustrated, the conductive solution-processed thin film material 36 may be formed into a rough pattern such as a circuit interconnect pattern used to connect multiple transistors. After a rough patterned deposit of the conductive solution-processed thin film material 36, refined patterning is conducted by laser ablation, as illustrated in FIG. 3B. In FIG. 3B, laser irradiation 38 tuned to a wavelength that will be selectively absorbed by the conductive solution-processed thin film material 36 is used to pattern a transistor channel 40 between the source and drain contacts 30 and 32. To reduce threshold voltage, the channel is preferably made narrow, e.g., less than 5 $\mu$m. Of course, some device architectures permit wider channels, and the maximum channel width is solely dependent upon device architecture. As for minimum channel width, channel widths of less than 1 $\mu$m can be formed with optimization of laser wavelengths and focusing optics depending upon the particular solution-processed materials used. Properly tuned laser radiation will ablate the conductive solution-processed thin film material and have a minimal or no effect on the underlying material, i.e., the substrate 34 in FIGS. 3A–3C.

After the transistor channel is formed 40, a thin film of semiconductor solution-processed thin film material is deposited to form an active region thin film layer 42 over the source and drain contacts and exposed portions of the substrate 34. Semiconductor material deposits into the transistor channel 40 during this part of the formation process. Formation of the semiconductor thin film layer is conducted in accordance with the invention, and as exemplified in FIGS. 1 and 2. Direct printing, and particularly ink jet printing, is also preferred for the deposition of a dielectric solution-processed thin film material to form an isolation layer 44 over the active region thin film layer 42, though other solution processing techniques, e.g. spin coating, may be used. Conductive solution-processed thin film material is then deposited upon the isolation layer 44 to form a gate contact 46. The gate contact deposit is preferably by inkjet printing. In addition, there may be a rough deposition of the gate contact 46 followed by selective ablation for refining the pattern. The gate contact 46 may form part of a circuit interconnect pattern, as well.

Figure 4A:
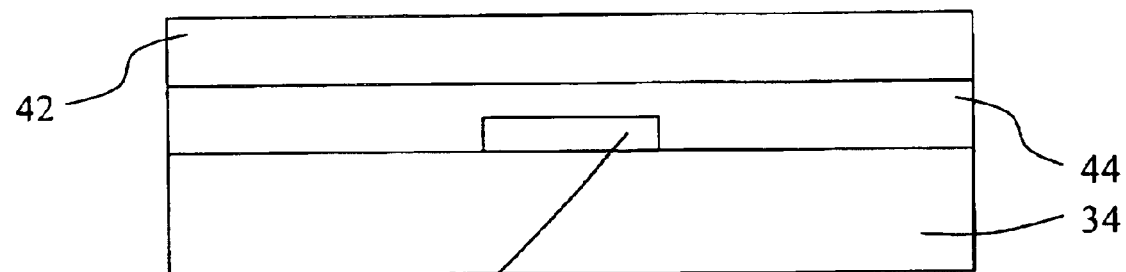
FIGS. 4A–4C are schematic block diagrams illustrating a second exemplary formation method and solution-processed thin film transistor of the invention.
Figure 4B:
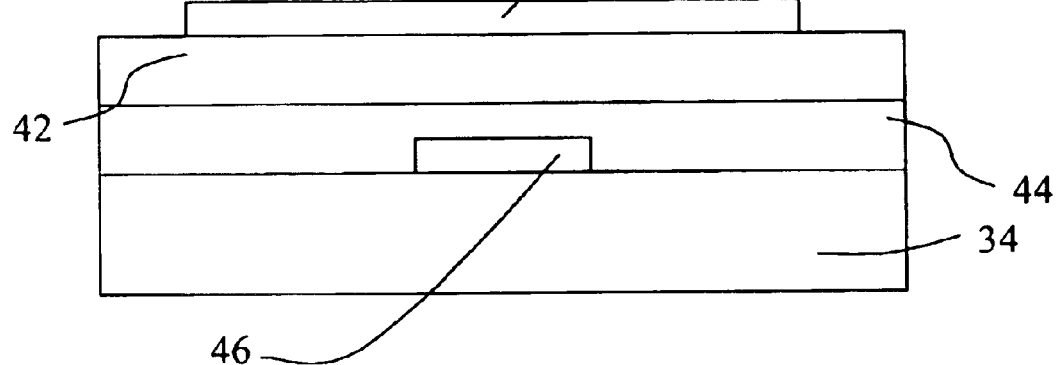
Figure 4C:
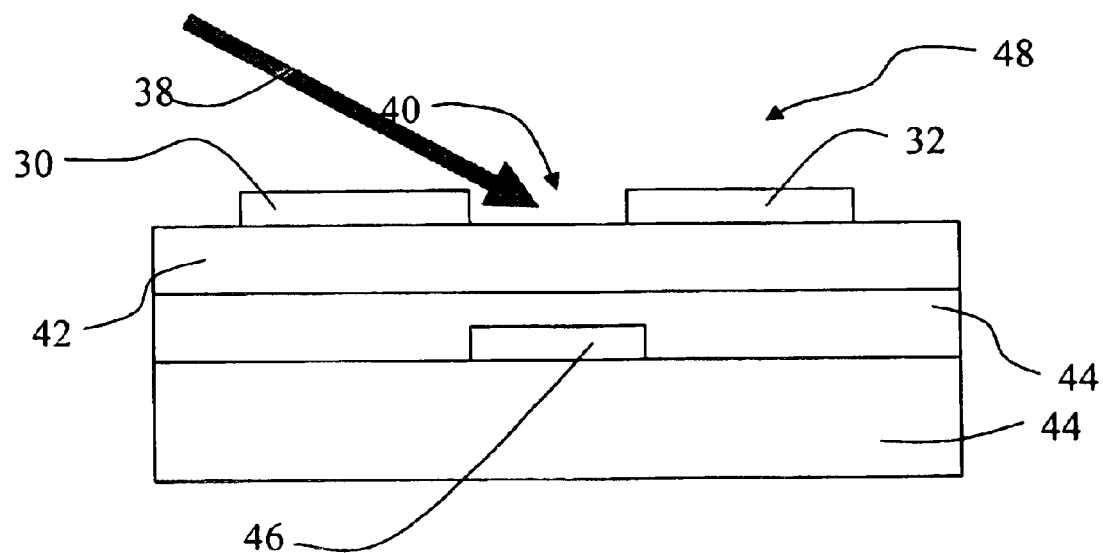

Referring now to FIGS. 4A–4C, a second exemplary embodiment formation method and solution-processed thin film transistor 48 of the invention are illustrated. Initially, conductive solution-processed thin film material is patterned upon the substrate 34 to form a gate contact 46. As in the FIGS. 3A–3C embodiment, the gate contact 46 may be patterned roughly by a deposit and then refined by laser ablation. The gate contact 46 may also form part of a circuit interconnect pattern. A dielectric solution-processed thin film material thin film layer 44 is then formed over the gate contact 46 and exposed portions of the substrate. This is followed by deposit of a semiconductor solution-processed thin film material active region thin film layer 42 and its laser heating to change its material state. Conductive solution-processed thin film material 36 is deposited on the semiconductor active region thin film layer 42. In FIG. 4B, laser irradiation 38 tuned to a wavelength that will be selectively absorbed by the conductive solution-processed thin film material 36 is used to pattern a transistor channel 40 between the source and drain contacts 30 and 32. The transistor channel 40 is understood to operate in the active region thin film layer 42, but the gap between the source and drain contacts 30 and 32 and created by the ablation defines the channel location.

Figure 5A:
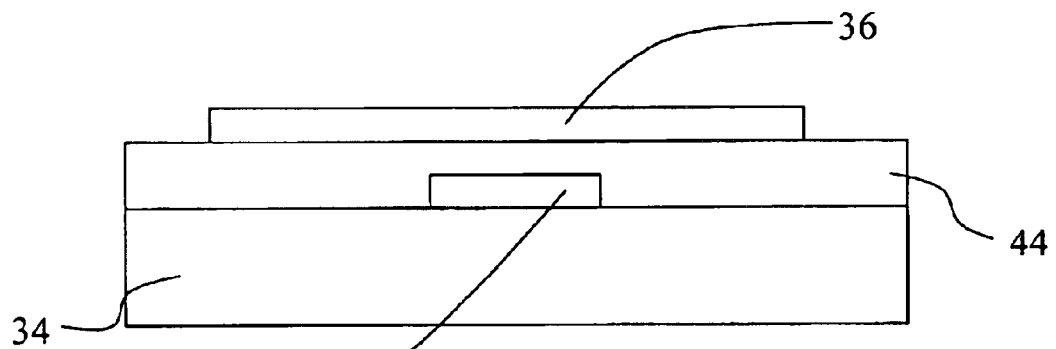
FIGS. 5A–5C are schematic block diagrams illustrating a third exemplary formation method and solution-processed thin film transistor of the invention.
Figure 5B:
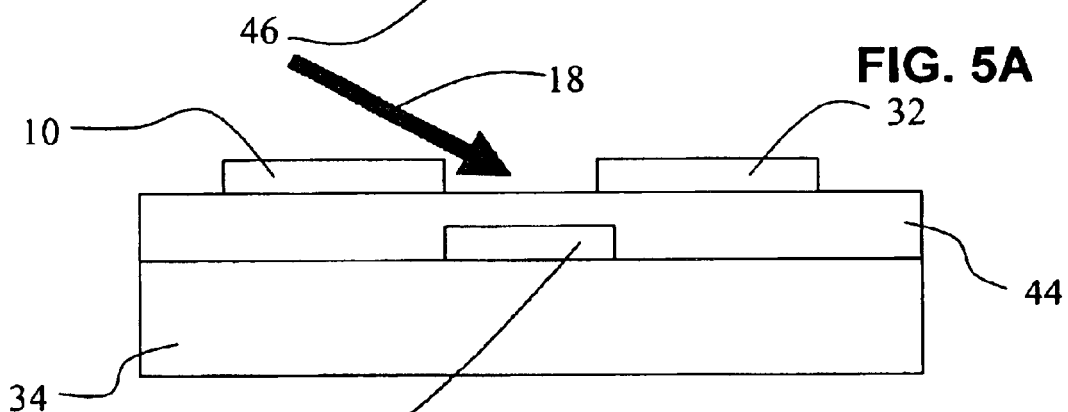
Figure 5C:
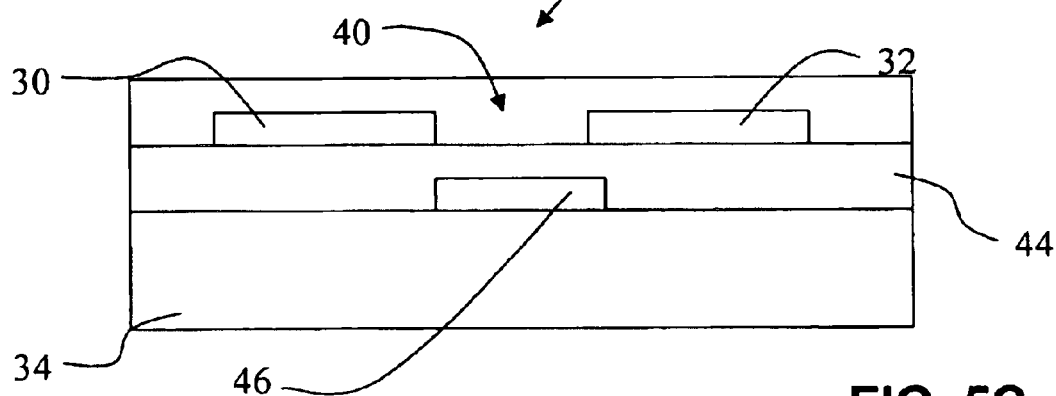

Referring now to FIGS. 5A–5C, a third exemplary embodiment formation method and solution-processed thin film transistor 50 of the invention are illustrated. Initially, conductive solution-processed thin film material is patterned upon the substrate 34 to form a gate contact 46. As in the other embodiments, the gate contact 46 may be patterned roughly by a deposit and then refined by laser ablation. The gate contact 46 may also form part of a circuit interconnect pattern. A dielectric solution-processed thin film material thin film layer 44 is then formed over the gate contact 46 and exposed portions of the substrate. Conductive solution-processed thin film material 36 is deposited on the dielectric solution-processed thin film material layer 44. In FIG. 5B, laser irradiation 18 tuned to a wavelength that will be selectively absorbed by the conductive solution-processed thin film material 36 is used to pattern a transistor channel 40 between the source and drain contacts 30 and 32. A semiconductor solution-processed thin film material is then deposited over the source and drain contacts and exposed portions of the dielectric solution-processed thin film material layer to form semiconductor solution-processed thin film material active region thin film layer 42.

Figure 6A:
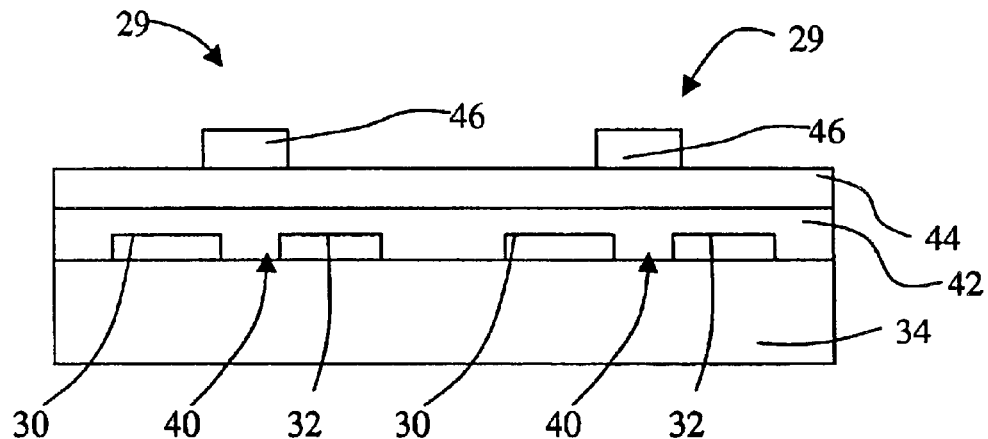
FIGS. 6A and 6B illustrate an exemplary embodiment device isolation step for the FIGS. 3A–3C formation method.
Figure 6B:
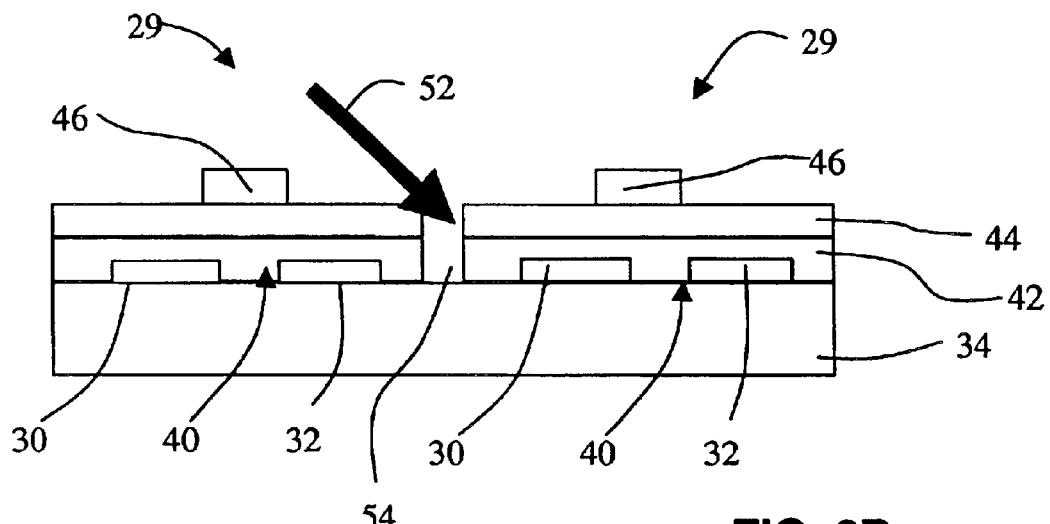
Figure 7:
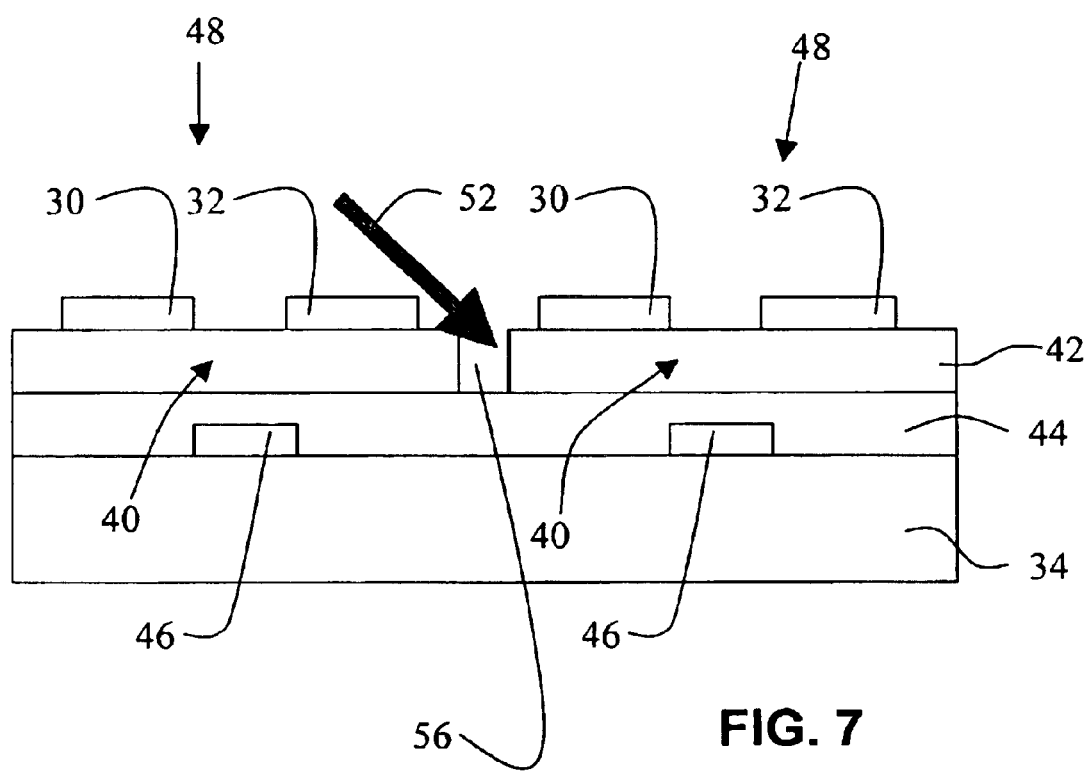
FIG. 7 illustrates an exemplary embodiment device isolation step for the FIGS. 4A–4C formation method.

FIGS. 6A and 6B illustrate an exemplary embodiment device isolation step for the FIGS. 3A–3C formation method. FIG. 6A illustrates two transistor devices 29 formed in accordance with FIGS. 3A–3C. The transistor devices 8 are formed as part of a single integration. In FIG. 6B laser irradiation 52 is tuned and controlled to ablate layers down to the substrate 34. The laser radiation may be varied in intensity or wavelength during the ablation of multiple layers. The ablation thereby creates a device isolation 54. In FIG. 6B, the device isolation takes the form of a gap. The gap may also be filled with isolation material, such as dielectric solution-processed thin film material. FIG. 7 illustrates a device isolation step for two transistor devices 48 formed in accordance with FIGS. 4A–4C. In the exemplary embodiment of FIG. 7, the laser irradiation is tuned and controlled to form a device isolation 56 through the semiconductor layer up to the dielectric solution-processed thin film material layer 44. An optical mask may be used to create multiple features simultaneously, such as multiple device isolations 56. As in FIGS. 6A and 6B, the device isolation takes the form of a gap and also may be filled with isolation material.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. A solution-processed thin film transistor formation method, comprising steps of:
   preparing solutions for solution deposit of thin film layers, including a semiconductor solution having a solution-processed semiconductor material contained in a solvent;

using said solutions, forming solution-processed thin films including conductive solution-processed thin film contacts, semiconductor solution-processed thin film active regions, and dielectric solution-processed thin film isolations in a sequence and organization to form a solution-processed thin film structure capable of transistor operation; and subsequent to a deposit of semiconductor material contained in a solvent used for forming of the semiconductor solution-processed thin film active regions but prior to deposit of any subsequent layers, selectively laser heating the semiconductor material contained in a solvent used for forming of the semiconductor solution-processed thin film active regions to vaporize the solvent to form the semiconductor solution processed thin film active regions.

2. The method of claim 1, wherein said step of preparing comprises dissolving semiconductor materials in a solvent to form the solution-processed semiconductor material.

3. The method of claim 2, wherein said step of forming conductive solution-processed thin films comprises direct printing.

4. The method of claim 3, wherein said step of forming conductive solution-processed thin films comprises ink jet printing.

5. The method of claim 2, wherein said step of preparing comprises dissolving small molecule organic semiconductor materials in a solvent to form the solution-processed semiconductor material.

6. The method of claim 2, wherein said step of preparing comprises dissolving a polymer semiconductor in an organic solvent.

7. The method of claim 6, further comprising a preliminary step of coating a surface unto which the polymer semiconductor in an organic solvent will be deposited, the coating comprising a film that will form directional structures in response to laser heating.

8. The method of claim 1, wherein said step of preparing comprises suspending semiconductor materials in a solvent to form the solution-processed semiconductor material.

9. The method of claim 8, wherein said step of forming conductive solution-processed thin films comprises direct printing.

10. The method of claim 9, wherein said step of forming conductive solution-processed thin films comprises ink jet printing.

11. The method of claim 8, wherein said step of preparing comprises suspending a small molecule organic semiconductor in an organic solvent.

12. The method of claim 8, wherein said step of preparing comprises suspending an inorganic semiconductor nanoparticles in an organic solvent.

13. The method of claim 12, wherein said step of forming solution processed conductive thin film contacts comprises direct printing.

14. The method of claim 1, wherein said step of selectively laser heating further cures, anneals, sinters or re-crystallizes the semiconductor material.

15. The method of claim 1, further comprising a step of selectively ablating one or more of the conductive solution-processed thin film contacts, the semiconductor solution-processed thin film active regions and the dielectric solution-processed thin film isolations to pattern or complete patterning of a material being selectively ablated, wherein said step of selectively ablating is carried out during or after said step of forming.

16. The method of claim 15, repeated to form a plurality of thin film structures capable of transistor operation and further comprising a step of forming device isolations by ablating material between structures.

17. The method of claim 16, further comprising a step of filling the device isolations with dielectric solution-processed thin film material.

18. The method of claim 17, wherein the conductive solution-processed thin film contacts are patterned to form a circuit interconnect pattern.

19. The method of claim 15, wherein said steps of forming and ablating comprise the following steps:

depositing drain and source conductive solution-processed thin film material upon a substrate;

selectively ablating a transistor channel in the drain and source conductive solution-processed thin films to form drain and source contacts;

depositing active region semiconductor solution-processed thin film material over the drain and source contacts and the substrate;

depositing isolation region dielectric solution-processed thin film material over the semiconductor solution-processed thin film material; and depositing gate conductive solution-processed thin film material upon the isolation region dielectric to form a gate contact.

20. The method of claim 15, wherein said steps of forming and ablating comprise the following steps:

depositing gate conductive solution-processed thin film material upon a substrate;

depositing isolation region dielectric solution-processed thin film material over the gate conductive solution-processed thin film material and the substrate;

depositing active region semiconductor solution-processed thin film material over the isolation region dielectric;

depositing drain and source conductive solution-processed thin film material upon the active region semiconductor solution-processed thin film material; and selectively ablating a transistor channel in the drain and source conductive solution-processed thin film material to form drain and source contacts.

21. The method of claim 15, wherein said steps of forming and ablating comprise the following steps:

depositing gate conductive solution-processed thin film material upon a substrate;

depositing isolation region dielectric solution-processed thin film material over the gate conductive solution-processed thin film material and the substrate;

depositing drain and source conductive solution-processed thin film material upon the isolation region dielectric solution-processed thin film material;

selectively ablating a transistor channel in the drain and source conductive solution-processed thin film material to form drain and source contacts; and depositing active region semiconductor solution-processed thin film material over the drain and source conductive solution-processed thin film material and the isolation dielectric.

22. The method of claim 15, wherein said step of selectively ablating uses a laser wavelength tuned to be absorbed by material being ablated and to minimally damage material underlying material being ablated.

23. The method of claim 15, wherein said step of selectively ablating is conducted through an optical mask to ablate multiple features simultaneously.

24. The method of claim 15, wherein said step of selectively ablating is carried out while varying one or both of a laser wavelength and intensity.

25. The method of claim 15, wherein said step of selectively ablating is applied to complete patterning of a material roughly patterned when deposited.

26. The method of claim 1, wherein the semiconductor material is ink jet deposited prior to said step of selectively laser heating.

27. The method of claim 1, wherein said step of preparing comprises dissolving small molecule organic semiconductor precursor materials in a solvent to form the solution-processed semiconductor material.

28. The method of claim 27, wherein said step of forming conductive solution-processed thin films comprises direct printing.

29. The method of claim 28, wherein said step of forming conductive solution-processed thin films comprises ink jet printing.

30. A solution-processed thin film transistor formation method, comprising steps of:

forming solution-processed thin film layers into a transistor structure; during said forming, selectively heating semiconductor portions of the transistor structure via a laser, to modify the material state of semiconductor material from a solution deposited material state to a thin film layer material state.

31. The method of claim 30, further comprising a preliminary step of dissolving semiconductor materials in a solvent to form the solution deposited material state of the semiconductor material.

32. The method of claim 31, wherein said step of dissolving comprises dissolving a small molecule organic semiconductor in a solvent.

33. The method of claim 31, wherein said step of dissolving comprises dissolving a polymer semiconductor in an organic solvent.

34. The method of claim 33, further comprising a preliminary step of coating a surface with a coating unto which the polymer semiconductor in an organic solvent will be deposited, the coating comprising a film that will form direction structures in response to laser heating.

35. The method of claim 30, further comprising a preliminary step of suspending semiconductor materials in a solvent to form the solution deposited material state of the semiconductor material.

36. The method of claim 35, wherein said step of suspending comprises suspending a small molecule organic semiconductor in an organic solvent.

37. The method of claim 35, wherein said step of suspending comprises suspending inorganic semiconductor materials in an organic solvent.

38. The method of claim 30, wherein said step of selectively laser heating further cures, anneals, sinters or re-crystallizes the semiconductor material.

39. The method of claim 30, further comprising, during said forming, patterning portions of the transistor structure via laser ablation, using a laser wavelength tuned to be absorbed by material being patterned and to minimally damage material underlying material being patterned.

40. The method of claim 39, wherein said step of patterning is applied to complete patterning of a material roughly patterned when deposited.

41. The method of claim 40, wherein the material roughly patterned when deposited is patterned as a result of an inkjet deposition process.

42. The method of claim 30, repeated to form a plurality of thin film structures capable of transistor operation and further comprising a step of forming device isolations by ablating material between structures.

43. The method of claim 42, further comprising a step of filing said device isolations with dielectric solution-processed thin film material.

44. A solution-processed thin film transistor including drain, source and gate contacts formed of conductive solution-processed thin film materials, a semiconductor solution-processed thin film material active region contacting the drain and source contacts and isolated from the gate contact by a dielectric solution-processed thin film material, the transistor being formed by a process comprising steps of:

direct printing a solution of semiconductor material;

depositing, in a rough pattern, the drain and source contacts; and refining the rough pattern by selective laser ablation of the drain and source contacts; and completing a semiconductor active region by selective laser heating the solution of the semiconductor material to vaporize solvent from the solution and leave a thin film of the semiconductor material.

45. The method of claim 44, wherein said step of refining creates a transistor channel.

46. The method of claim 44, wherein said step of refining is conducted through an optical mask to ablate multiple features simultaneously.

47. The method of claim 44, wherein said step of refining is carried out while varying one or both of a laser wavelength and intensity.

* * * * *